(12) United States Patent
Sorenson et al.

(10) Patent No.: US 10,514,261 B2
(45) Date of Patent: Dec. 24, 2019

(54) GYROMAGNETIC GEOPOSITIONING SYSTEM

(71) Applicant: HRL Laboratories, LLC, Malibu, CA (US)

(72) Inventors: Logan D. Sorenson, Thousand Oaks, CA (US); Hung Nguyen, Los Angeles, CA (US); Raviv Perahia, Agoura Hills, CA (US); Deborah J. Kirby, Calabasas, CA (US); Richard J. Joyce, Thousand Oaks, CA (US); David T. Chang, Calabasas, CA (US)

(73) Assignee: HRL Laboratories, LLC, Malibu, CA (US)

(*) Notice: Subject to any disclaimer, the term of this patent is extended or adjusted under 35 U.S.C. 154(b) by 114 days.

(21) Appl. No.: 15/387,435

(22) Filed: Dec. 21, 2016

(65) Prior Publication Data
US 2017/0292840 A1    Oct. 12, 2017

Related U.S. Application Data

(60) Provisional application No. 62/321,042, filed on Apr. 11, 2016.

(51) Int. Cl.
*G01C 21/08* (2006.01)
*G01R 33/02* (2006.01)
*G01V 7/00* (2006.01)

(52) U.S. Cl.
CPC .......... *G01C 21/08* (2013.01); *G01R 33/0206* (2013.01); *G01V 7/00* (2013.01)

(58) Field of Classification Search
CPC .................................................. G01C 21/08
See application file for complete search history.

(56) References Cited

U.S. PATENT DOCUMENTS

| 5,420,592 A | 5/1995 | Johnson |
| 6,493,631 B1 | 12/2002 | Burns |
| 2010/0045701 A1* | 2/2010 | Scott ............. G01S 5/163 345/633 |
| 2013/0311084 A1 | 11/2013 | Lundquist et al. |
| 2013/0317741 A1 | 11/2013 | Brashear et al. |

FOREIGN PATENT DOCUMENTS

EP    1 860 403 B1    8/2011

OTHER PUBLICATIONS

International Search Report and Written Opinion for Application No. PCT/US2016/068148, dated Apr. 12, 2017 (18 pages).

(Continued)

*Primary Examiner* — John E Breene
*Assistant Examiner* — Jeffrey C Morgan
(74) *Attorney, Agent, or Firm* — Lewis Roca Rothgerber Christie, LLP

(57) ABSTRACT

A geopositioning system. The geopositioning system includes an accelerometer including three sensing axes, a gyroscope including three sensing axes, and a magnetometer including three sensing axes, and a processing circuit. The processing circuit is configured to calculate a location of the geopositioning system as a latitude, longitude, and altitude with respect to the Earth.

20 Claims, 6 Drawing Sheets

(56) References Cited

OTHER PUBLICATIONS

Chulliat, Arnaud et al., "The US/UK World Magnetic Model for 2015-2020: Technical Report", National Geophysical Data Center, NOAA, 2015, 112 pages.
Frosio, Iuri et al., "Autocalibration of MEMS Accelerometers", IEEE Transactions on Instrumentation and Measurement, Jun. 2009, pp. 2034-2041, vol. 58, No. 6.
Prikhodko, Igor P., "What is MEMS Gyrocompassing? Comparative Analysis of Maytagging and Carouseling", Journal of Microelectromechanical Systems, Dec. 2013, pp. 1257-1266, vol. 22, No. 6.
U.S. Appl. No. 15/253,704, filed Aug. 31, 2016.
U.S. Appl. No. 15/253,694, filed Aug. 31, 2016.
"U.S./U.K. World Magnetic Model—Epoch 2015.0 Geomagnetic Longitude and Latitude", Dec. 2014, NOAA/NGDC & CIRES, 1 page.
International Preliminary Report on Patentability dated May 1, 2018 for corresponding PCT Application No. PCT/US2016/068148 (7 pages).

* cited by examiner

GYROMAGNETIC GEOPOSITIONING SYSTEM

CROSS-REFERENCE TO RELATED APPLICATION(S)

The present application claims priority to and the benefit of U.S. Provisional Application No. 62/321,042, filed Apr. 11, 2016, titled "STABILIZATION OF CORIOLIS VIBRATORY GYROSCOPES BY FREQUENCY LOCKING TO ULTRA STABLE CLOCKS", the entire content of which is incorporated herein by reference. The present application is related to U.S. patent application Ser. No. 15/253,704, filed on Aug. 31, 2016, titled "HIGH STABILITY ANGULAR SENSOR", ("the HSAS Application"), and to U.S. patent application Ser. No. 15/253,694, filed on Aug. 31, 2016, titled "HIGH DYNAMIC RANGE GYROSCOPE", the entire contents of both of which are incorporated herein by reference.

FIELD

One or more aspects of embodiments according to the present invention relate to position estimating instruments, and more particularly to a system for estimating a position from a magnetic field, a gravitational field, and a spin axis.

BACKGROUND

In various commercial and military systems there is a need to estimate the position of the system on the surface of the Earth. Related art Global Positioning System (GPS) receivers, or other similar instruments receiving signals from other constellations of satellites, may provide such position information, but GPS receivers may suffer from purposeful, accidental, and/or natural interference which may degrade and/or deny the performance of the system.

This may be especially critical in military use, where GPS denial can lead to tactical disadvantages. GPS-type approaches may also suffer from a large power draw associated with receiving the weak GPS signals, reducing battery life of portable receiver units and leading to long times required to lock on to the system's location, especially if there is no initial guess of the system's position.

To reduce the impact of GPS denied/degraded systems, inertial measurement units (IMUs) comprising 3-axis accelerometers and 3-axis gyroscopes may be used to measure the acceleration and rotation rates of the system and integrate these to provide an estimate of the position and orientation relative to a known starting point. However, the accuracy of this type of navigation (known as "dead-reckoning") may degrade with time because of drift of the sensors arising due to their noise.

Thus, there is a need for a position-estimating system providing stable accuracy and that does not rely on information received from a constellation of satellites.

SUMMARY

Aspects of embodiments of the present disclosure are directed toward a geopositioning system that includes an accelerometer including three sensing axes, a gyroscope including three sensing axes, and a magnetometer including three sensing axes, and a processing circuit. The processing circuit is configured to calculate a location of the geopositioning system as a latitude, longitude, and altitude with respect to the Earth.

According to an embodiment of the present invention there is provided a geopositioning system, including: an accelerometer including three sensing axes; a gyroscope including three sensing axes; a magnetometer including three sensing axes; and a processing circuit, the processing circuit being configured to calculate a location of the geopositioning system as a latitude, longitude, and altitude with respect to the Earth based on the combined output of the accelerometer, the gyroscope, and the magnetometer.

In one embodiment, the calculating of the location includes: determining a plane of a local horizon from measurements performed by the accelerometer; determining a direction of a spin axis of the Earth from measurements performed by the gyroscope; and calculating the latitude from the angle between the local horizon and the spin axis.

In one embodiment, the calculating of the latitude includes: forming a dot product between a normal vector to the plane of the local horizon, and a normalized vector in the direction of the spin axis of the Earth; calculating an inverse cosine of the dot product; and subtracting 90 degrees from the inverse cosine.

In one embodiment, the calculating of the location further includes: calculating the longitude from the spin axis; and measurements obtained by the magnetometer.

In one embodiment, the calculating of the longitude includes numerically solving for a value of l for which $$\frac{\vec{a}^n \cdot \vec{B}^n}{\|\vec{a}^n\| \cdot \|\vec{B}^n\|} = -\frac{2 \cdot [g_1^0 sL + (g_1^1 cl + h_1^1 sl) cL]}{[g_1^0 cL - (g_1^1 cl + h_1^1 sl) sL]^2 + [g_1^1 sl + h_1^1 cl]^2 + 4 \cdot [g_1^0 sL + (g_1^1 cl + h_1^1 sl) cL]^2}$$

wherein $\vec{a}^n$ is an acceleration vector measured by the accelerometer;

$\vec{B}^n$ is a magnetic field vector measured by the magnetometer;

$g_1^0$, $g_1^1$, and $h_1^1$ are three coefficients of a magnetic field model for the Earth;

cL and sL are the sine and cosine respectively of the latitude;

l is the longitude; and cl, and sl are the sine and cosine respectively of the longitude.

In one embodiment, $g_1^0 = -29438.5$ nanoTesla (nT);

$g_1^1 = -1501.1$ nT; and $h_1^1 = 4796.2$ nT.

In one embodiment, the calculating of the altitude includes calculating the altitude from measurements obtained by the accelerometer.

In one embodiment, the calculating of the altitude from measurements obtained by the accelerometer includes: calculating a magnitude of an acceleration vector measured by the accelerometer; and determining an altitude at which a magnitude predicted by a gravitational model of the Earth equals the magnitude of the acceleration vector.

In one embodiment, the gravitational model of the Earth represents the Earth's gravitational field as being proportional to $$\frac{1}{r^2},$$

where r is the radius from the center of the Earth.

In one embodiment, the calculating of the altitude includes calculating the altitude from measurements obtained by the magnetometer.

In one embodiment, the calculating of the altitude from measurements obtained by the magnetometer includes: calculating a magnitude of a magnetic field vector measured by the magnetometer; and determining an altitude at which a magnitude predicted by a magnetic model of the Earth equals the magnitude of the magnetic field vector.

In one embodiment, the magnetic model represents the Earth's magnetic field as being proportional to $$\frac{1}{r^3},$$

where r is the radius from the center of the Earth.

In one embodiment, the calculating of the altitude includes calculating the altitude from: measurements obtained by the accelerometer; and measurements obtained by the magnetometer.

In one embodiment, the calculating of the altitude includes calculating the altitude as a weighted average of: an altitude calculated from measurements obtained by the accelerometer; and an altitude calculated from measurements obtained by the magnetometer.

In one embodiment, weights of the weighted average are selected to provide, in the weighted average, a measurement error less than the measurement error in an equally-weighted average of the altitude calculated from measurements obtained by the accelerometer; and the altitude calculated from measurements obtained by the magnetometer.

According to an embodiment of the present invention there is provided a geopositioning system, including: an accelerometer including two sensing axes; a gyroscope including one sensing axis; a magnetometer including three sensing axes a gimbaled support; and a processing circuit, the accelerometer, the gyroscope, and the magnetometer being secured to the gimbaled support, the processing circuit being configured to control the gimbaled support and to calculate a location of the geopositioning system as a latitude, longitude, and altitude with respect to the Earth based on the output from the accelerometer, the gyroscope, and the magnetometer.

In one embodiment, the two sensing axes of the accelerometer define a plane, and the gyroscope is secured to the gimbaled table with the sensing axis of the gyroscope in the plane.

In one embodiment, the processing circuit is configured to rotate the gimbaled table to an attitude at which each of the two sensing axes of the accelerometer measures no acceleration, and at which the sensing axis of the gyroscope measures no rotation.

In one embodiment, the processing circuit is further configured to calculate the longitude by numerically solving for a value of l for which $$\frac{\vec{a}^n \cdot \vec{B}^n}{\|\vec{a}^n\| \cdot \|\vec{B}^n\|} = -\frac{2 \cdot [g_1^0 sL + (g_1^1 cl + h_1^1 sl)cL]}{[g_1^0 cL - (g_1^1 cl + h_1^1 sl)sL]^2 + [g_1^1 sl + h_1^1 cl]^2 + 4 \cdot [g_1^0 sL + (g_1^1 cl + h_1^1 sl)cL]^2}$$

wherein $\vec{a}^n$ is an acceleration vector measured by the accelerometer;

$\vec{B}^n$ is a magnetic field vector measured by the magnetometer;

$g_1^0$, $g_1^1$, and $h_1^1$ are three first Gauss coefficients of a magnetic field model for the Earth;

cL and sL are the sine and cosine respectively of the latitude;

l is the longitude; and cl, and sl are the sine and cosine respectively of the longitude.

In one embodiment, the calculating of the altitude includes calculating the altitude as a weighted average of: an altitude calculated from measurements obtained by the accelerometer; and an altitude calculated from measurements obtained by the magnetometer.

According to an embodiment of the present invention there is provided a method for determining a location of a geopositioning system, the geopositioning system including: an accelerometer including three sensing axes; a gyroscope including three sensing axes; and a magnetometer including three sensing axes, the method including calculating a location of the geopositioning system as a latitude, longitude, and altitude with respect to the Earth based on the combined output of the accelerometer, the gyroscope, and the magnetometer.

BRIEF DESCRIPTION OF THE DRAWINGS

These and other features and advantages of the present invention will be appreciated and understood with reference to the specification, claims, and appended drawings wherein:

DETAILED DESCRIPTION

Figure 1:
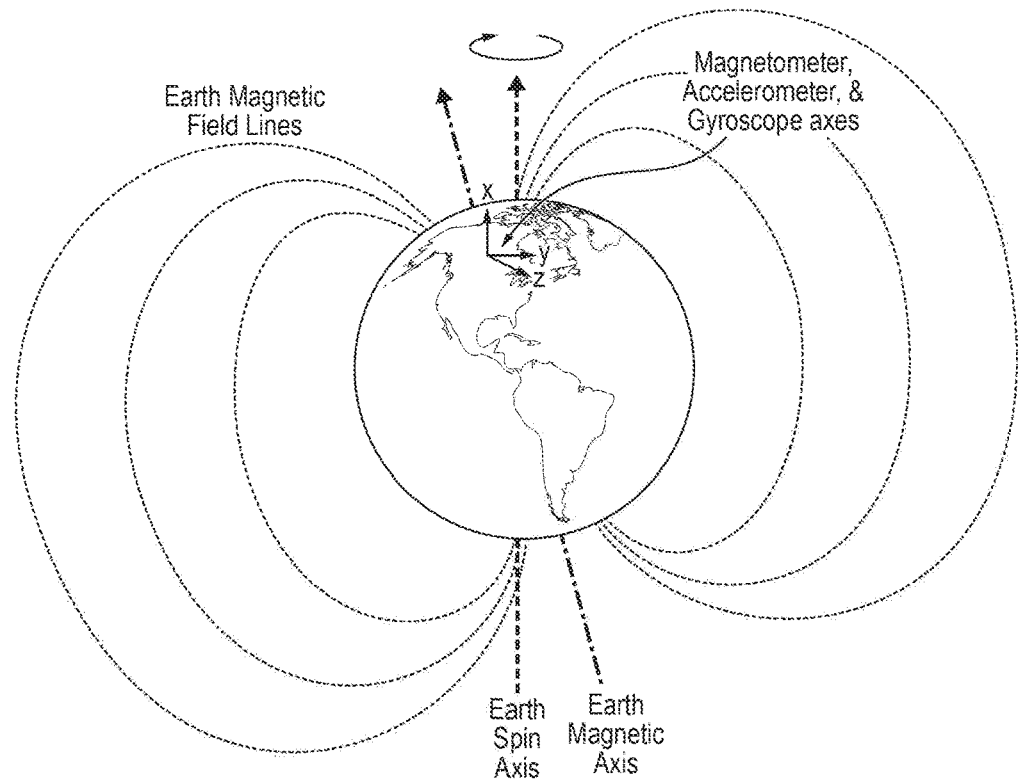
FIG. 1 is an illustration of the spin and magnetic axes of the Earth as employed by an embodiment of the present invention.

The detailed description set forth below in connection with the appended drawings is intended as a description of exemplary embodiments of a gyromagnetic geopositioning system (GMGPS) provided in accordance with the present invention and is not intended to represent the only forms in which the present invention may be constructed or utilized. The description sets forth the features of the present invention in connection with the illustrated embodiments. It is to be understood, however, that the same or equivalent functions and structures may be accomplished by different embodiments that are also intended to be encompassed within the spirit and scope of the invention. As denoted elsewhere herein, like element numbers are intended to indicate like elements or features.

Embodiments of the present invention relate to a device for locating its position (and that of the object to which the device is attached or embedded) relative to the gravitational field, magnetic field, and spin axes of the Earth (or any other planetary body that generates a dipolar magnetic field along one axis and spins about another axis). The device includes three 3-axis sensors (nine total sensors): a 3-axis magnetometer to measure the strength and orientation of Earth's magnetic field in terms of its orthogonal components, a 3-axis gyroscope to measure the components of Earth's rotation about its axis, and a 3-axis accelerometer to measure the gravitational field components. Embodiments of the present invention exploit the combination of the 3-axis gyroscope, the 3-axis magnetometer, and the 3-axis accelerometer to provide an absolute position of the device on Earth's surface in terms of latitude and longitude by measuring these naturally occurring orientation and geopositioning signals. Unlike a related art GPS (Global Positioning System) receiver, embodiments of the present invention do not require a constellation of orbiting satellites to perform a geopositioning function. The device may be combined with a map or model of local variations in Earth's magnetic field, and/or with a map or model of local variations in Earth's gravitational field, to improve the positional accuracy.

As used herein, a sensor having one sensing axis, i.e., capable of sensing along one axis, is also referred to as a 1-axis sensor. For example, a gyroscope having one sensing axis is also referred to as a 1-axis gyroscope, an accelerometer having one sensing axis is also referred to as a 1-axis accelerometer, and a magnetometer having one sensing axis is also referred to as a 1-axis magnetometer. The terminology for 2-axis and 3-axis sensors with orthogonal sensing axes is analogous, so that, for example, a gyroscope having three orthogonal sensing axes is also referred to as a 3-axis gyroscope.

In some embodiments, the combination of the 9 total natural geopositioning signals sensed by the combination of the 3-axis sensors to form 3 vectors: Earth's spin axis vector, Earth's magnetic field vector, and Earth's gravitational field vector is utilized to extract the latitude and longitude position. The accuracy of this position may depend on the performance grade of the sensors used.

Unlike related art position estimating systems using dead reckoning, which may produce position estimates the accuracy of which degrades with time due to sensor drift, embodiments of the present invention may produce position estimates the accuracy of which remains constant or improves with time. The absolute position information produced by embodiments of the present invention may however nonetheless be combined with related art short-term inertial dead-reckoning to improve overall system performance and latency.

Embodiments of the present invention may provide absolute position accuracy comparable to that provided by related-art GPS receivers, using natural signals which are less prone to intentional and/or unintentional interference. Further, embodiments of the present invention may provide lower power consumption since the signal strengths may be greater than GPS signals. Some embodiments of the present invention may complement and augment a system using a GPS receiver by reducing the time to acquisition of the GPS lock by providing a coarse initial location estimate (which may be feasible using only low-cost commercial off-the-shelf (COTS) sensors). Embodiments of the present invention may be of particular benefit in environments where GPS is completely denied or inaccessible, such as in underwater vehicles or in subterranean navigation. Some embodiments allow zeroing of inertial measurement unit (IMU) dead-reckoning errors by detecting when motion has stopped (i.e., when there is no motion in the absolute reference frame of Earth).

Embodiments of the present invention may be superior to "gyrocompassing," a method in which a high performance gyroscope is used to identify the true North corresponding to the spin axis of the Earth. In gyrocompassing, two accelerometers are used to identify the local horizon by rotating the measurement platform until the accelerometer outputs are zero (nulled), after which the high performance gyroscope may be rotated in the local horizon until its output is also nulled. At this point, the gyroscope input axis is pointing East and the cardinal directions North (sensor X axis), East (sensor Y axis), and Down (sensor Z axis) are known (see FIG. 1). The angle between the Down direction determined by the accelerometers and the Earth spin axis determined by the gyro(s) is a measure of the latitude of the device.

Embodiments of the present invention use knowledge of the local magnetic field to further provide the longitude of the device (which may not be provided by a gyrocompassing system) to an accuracy depending on the grade of the magnetometer. Also, use of 3-axis devices (accelerometers, gyroscopes, and magnetometers) may allow virtual rotation of the vectors to determine the latitude and longitude without resorting to physical rotations to align the platform to the local horizon or to rotate the gyroscope within the local horizon. Some embodiments may, in one mode of operation, provide a capability to perform gyrocompassing.

The accuracy with which geopositioning is performed depends in some embodiments on the accuracy of the 3-axis sensors. For example, accuracy of 1 m (corresponding to 1 m/6317 km (radius of Earth)=158 parts per billion (ppb) accuracy) may be achieved with accelerometers having 1 g*158 ppb=158 ng resolution, gyroscopes having 15 dph*158 ppb=2.4 micro-dph drift ("dph" signifying degrees per hour), and magnetometers with an accuracy of 22 uT*158 ppb=3.5 pT (T being an abbreviation for Tesla).

The above level of performance for the accelerometer may be provided with related art commercial off the shelf (COTS) accelerometers fabricated as microelectromechanical systems (MEMS). The above level of performance for the gyroscope may be achieved with a gyroscope constructed according to an embodiment disclosed in the HSAS Application, identified above and incorporated herein by reference. The above level of performance for the magnetometer may be achieved by using a larger magnetometers than related art MEMS scale magnetometers, and having performance approximately (about) 1000 times better than related art MEMS scale magnetometers.

Lower performance 3-axis sensors may be used, and in this case the performance of the GMGPS may be accordingly reduced. For example, if the performance of each 3-axis sensor is reduced by a factor of 1000 relative to the performance levels identified above, the geopositioning device may achieve 1000 m (instead of 1 m) position accuracy, which may be sufficient for some applications, e.g., for fast GPS locking and GPS-aided inertial dead-reckoning navigation.

FIG. 1 shows the spin axis and magnetic axis of Earth. The Earth's spin axis defines the true geographic north pole. The Earth's magnetic axis is tilted from the spin axis, such that the magnetic north pole deviates from the true north pole. Embodiments of the present invention exploit this tilt to define a reference plane relative to which longitude can be measured by a combination of a 3-axis magnetometer, 3-axis accelerometer, and 3-axis gyroscope. In this manner the GMGPS identifies the longitude of the location of the device on Earth's surface. The magnetic axis and the spin axis define a plane which intersects the entire Earth. Since longitude is derived from the true geographic north pole (i.e., longitudes measure the angular position about the Earth's spin axis relative to an arbitrary reference plane), the plane defined by the magnetic axis and the spin axis of the Earth can be used as a first order (approximate) reference plane for determining the longitude of the device on Earth's surface. The latitude can be determined by ordinary gyrocompassing, or by detection of the total magnetic field (e.g., if the vehicle is constrained to Earth's surface, the total magnetic field is equivalent to a magnetic latitude from which the true latitude can be determined as in FIG. 3), or by a combination of the two approaches.

Figure 2:
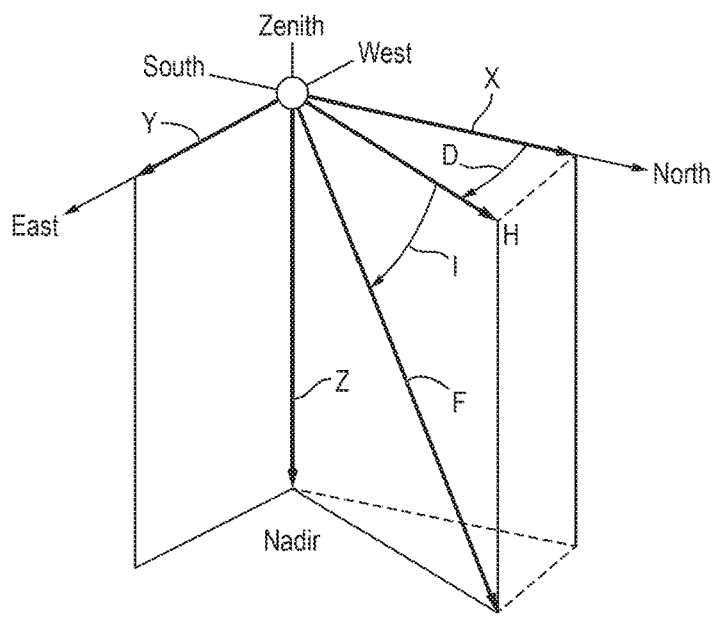
FIG. 2 is a vector diagram illustrating components of the Earth's magnetic field, according to an embodiment of the present invention.

FIG. 2 shows the decomposition of Earth's magnetic field into various components, including the North, East, and Down (Nadir) components which can be determined by physical or virtual gyrocompassing to align the X, Y, and Z sensor axes correspondingly. In FIG. 2, D and I are the declination (from true North) and inclination angles (from the local horizon) of Earth's magnetic field, respectively. H is the strength of the magnetic field in the local horizon, and F is the total strength of the magnetic field. X, Y, and Z are the sensor axes after alignment by gyrocompassing.

Figure 3:
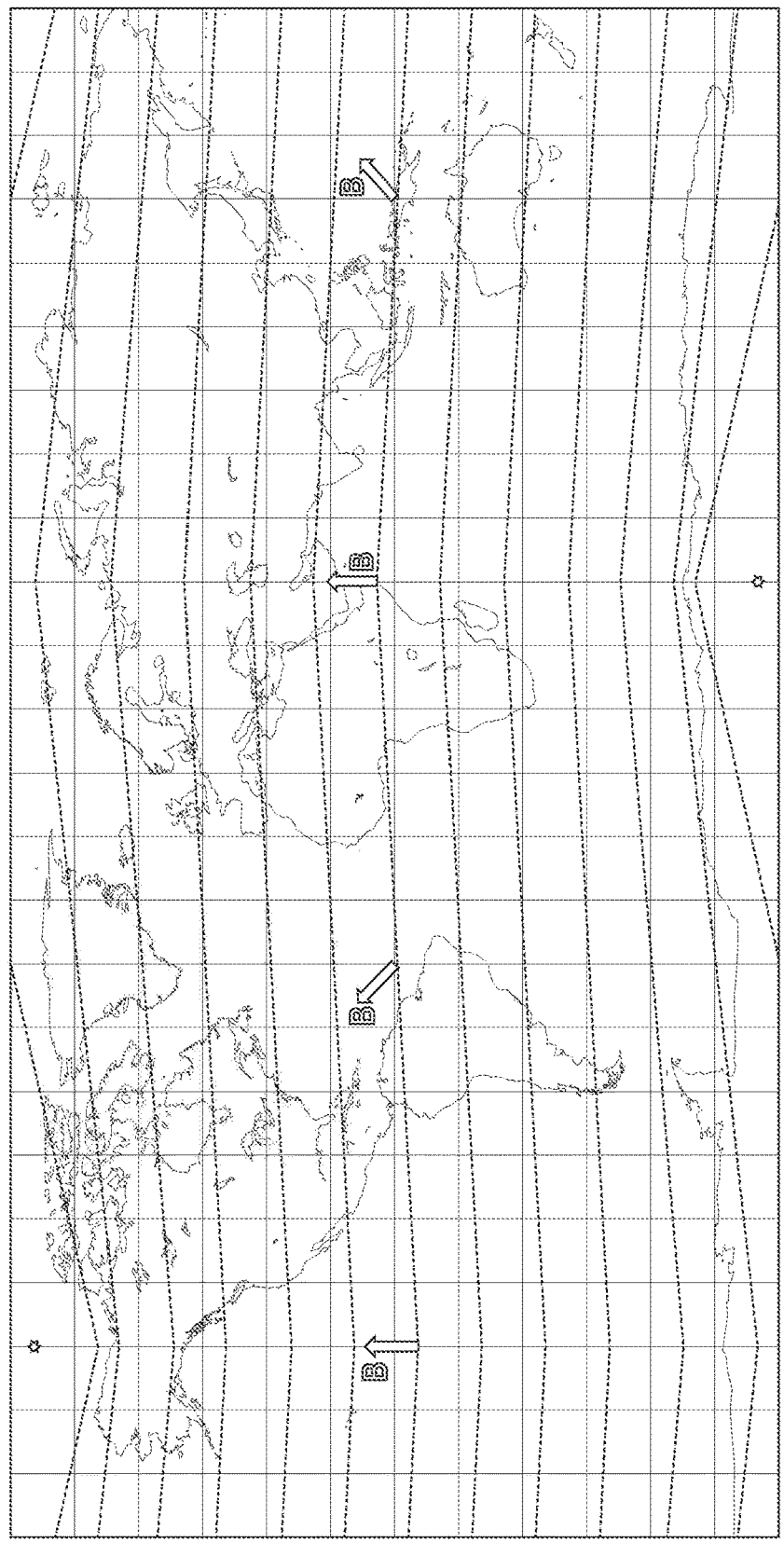
FIG. 3 is diagram showing contours of constant magnetic field strength superimposed on a map of the Earth, according to an embodiment of the present invention.

FIG. 3 simplifies the Earth's magnetic field into a dipole magnetic field and projects this field onto the surface of the Earth (solid lines indicate geographic latitudes, and geographic longitudes). The horizontal and vertical solid lines correspond to North and East directions in FIG. 2. The dashed lines correspond approximately to contours of constant magnetic field strength (the magnetic latitude). The stars mark the locations of the dipole axis. From FIG. 3, it can be seen that the magnetic field vector B (the magnitude and direction of which depends on the position on the Earth's surface) modulates its direction between North and East around the magnetic equator. Hence, a 3-axis magnetometer with its X, Y, and Z axes aligned to the North, East, and Down axes of FIG. 2 by gyrocompassing can determine the longitude in a dipole magnetic field by measuring the ratio of the Y (East) magnetometer output to the X (North) magnetometer output.

In FIG. 3, lines of constant dipole field strength (dashed lines) define "magnetic latitudes". When tracking along a magnetic latitude line from West to East (e.g., the equatorial line), the magnetic field direction is modulated from true North to a combination of a North and East component because the dipole field always points toward the North magnetic poles. For simplicity, considering the magnetometer axes to have been oriented by gyrocompassing so that the X axis points North and the Y axis points East, the longitude can be determined by the ratio of its Y output to its X output. This simplified example illustrates the working principle of some embodiments of the present invention in determining the longitude and latitude of the sensor.

Figure 4A:
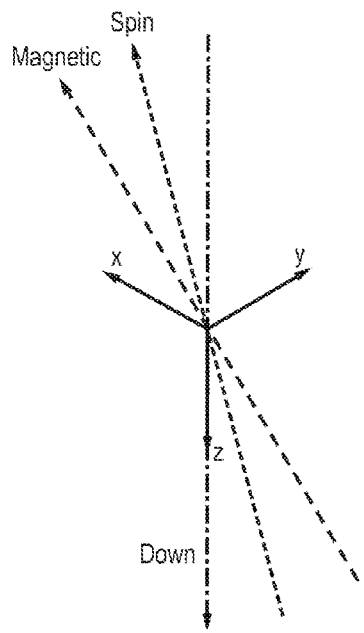
FIG. 4A is a first vector diagram illustrating the Earth's spin axis, magnetic field vector, and gravitational field vector relative to the three sensor axes X, Y, and Z, according to an embodiment of the present invention.
Figure 4B:
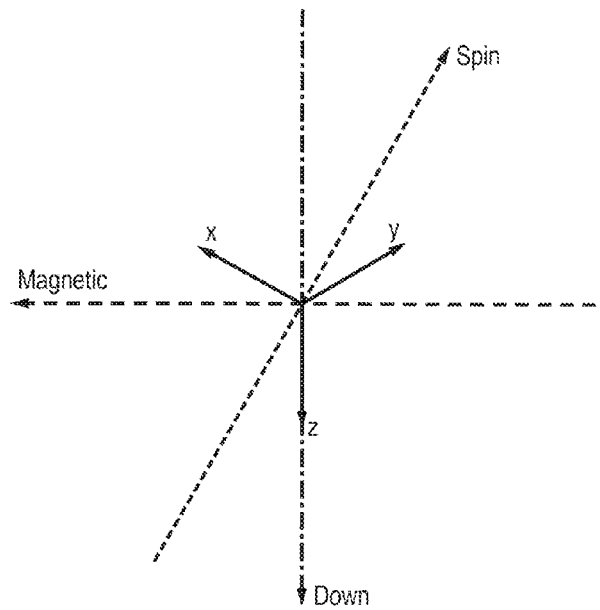
FIG. 4B is a second vector diagram illustrating the Earth's spin axis, magnetic field vector, and gravitational field vector relative to the three sensor axes X, Y, and Z, according to an embodiment of the present invention.
Figure 4C:
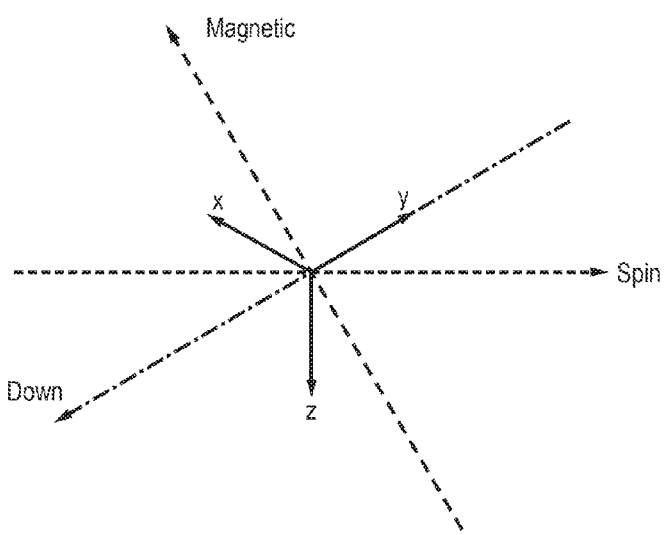
FIG. 4C is a third vector diagram illustrating the Earth's spin axis, magnetic field vector, and gravitational field vector relative to the three sensor axes X, Y, and Z, according to an embodiment of the present invention.

FIGS. 4A-4C show different orientations of the Earth's spin axis ("Spin"), magnetic field vector ("Magnetic"), and gravitational field vector ("Down") representing the Down/Nadir direction normal to the plane of the local horizon. In FIG. 4A, the Down direction is aligned to the Z axis of the sensor suite (i.e., the suite of three 3-axis sensors). The spin axis is aligned to the X direction, but may have some inclination out of the plane of the local horizon (which is essentially the latitude). This is the normal configuration after alignment by gyrocompassing. The magnetic field vector may be in or out of the plane defined by the Down vector and the spin axis (XZ plane). The angle of the magnetic field vector relative to the XZ plane in this case is related to the longitude. FIG. 4B shows an alternate configuration of the vectors in which the spin axis has not been gyrocompassed to align to the X direction. However, latitude and longitude can still be calculated since these angles are solely determined by the relative orientations of the three vectors. FIG. 4C shows the same relative orientation of the geopositioning signal vectors but at a different orientation relative to the sensor axes. Since again the latitude and longitude are determined solely by the relative arrangement of the geopositioning signal vectors, the orientations can be calculated by virtual rotation if 3-axis sensors of each type are used.

As FIGS. 4A-4C illustrate, physical gyrocompassing is not necessary if a full 3-axis sensor suite (accelerometers, magnetometers, gyroscopes) is used. This is because the latitude and longitude position is encoded into the relative orientation of the 3 geopositioning signal vectors (Down vector, spin axis, and magnetic field) measured by the 3-axis sensor suite. Determination of the plane of local horizon and the plane defined by the Down vector and the spin axis may be referred to as "virtual gyrocompassing" which can be done in the digital domain after sensor measurements have been taken.

Figure 5:
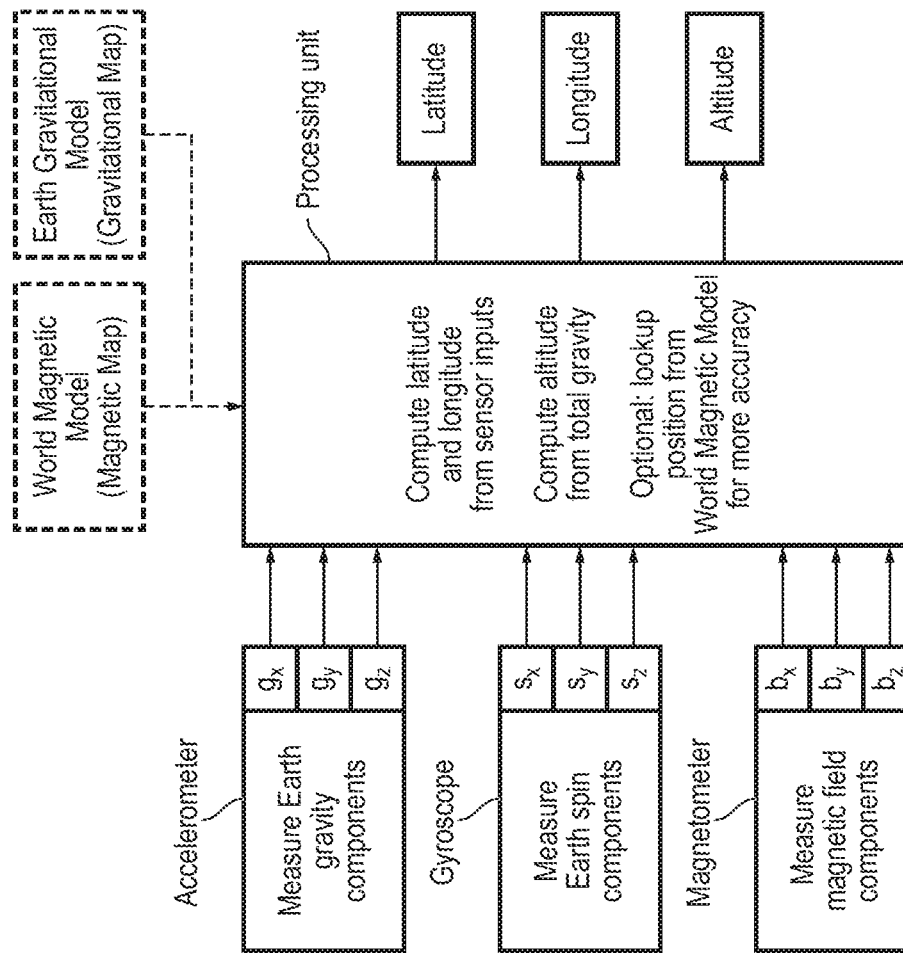
FIG. 5 is a hybrid block and data flow diagram of an embodiment of the present invention.

FIG. 5 shows a block diagram of an embodiment of the present invention and method for computing the latitude and longitude from concurrent or simultaneous measurement of all three 3-axis sensors determining the relative orientations of the geopositioning signal vectors as indicated in FIG. 4. For coarse geopositioning, a dipole model of the Earth's magnetic field may be assumed. For fine positioning, an accurate magnetic map such as the World Magnetic Model (WMM) and/or a gravitational map such as the Earth Gravitational Model (EGM) may be used to look up a more accurate position based on the sensor inputs. Altitude may be determined from the strength of the total gravity and magnetic fields.

One embodiment of the GMGPS shown in FIG. 5 involves first calculating the latitude and the longitude from the sensor measurements. Then, the altitude can be calculated from either the total gravity or the total magnetic field, or ultimately, a combination of both. This procedure may involve the definition of several reference frames (i.e., coordinate systems) to facilitate the calculations.

Figure 6:
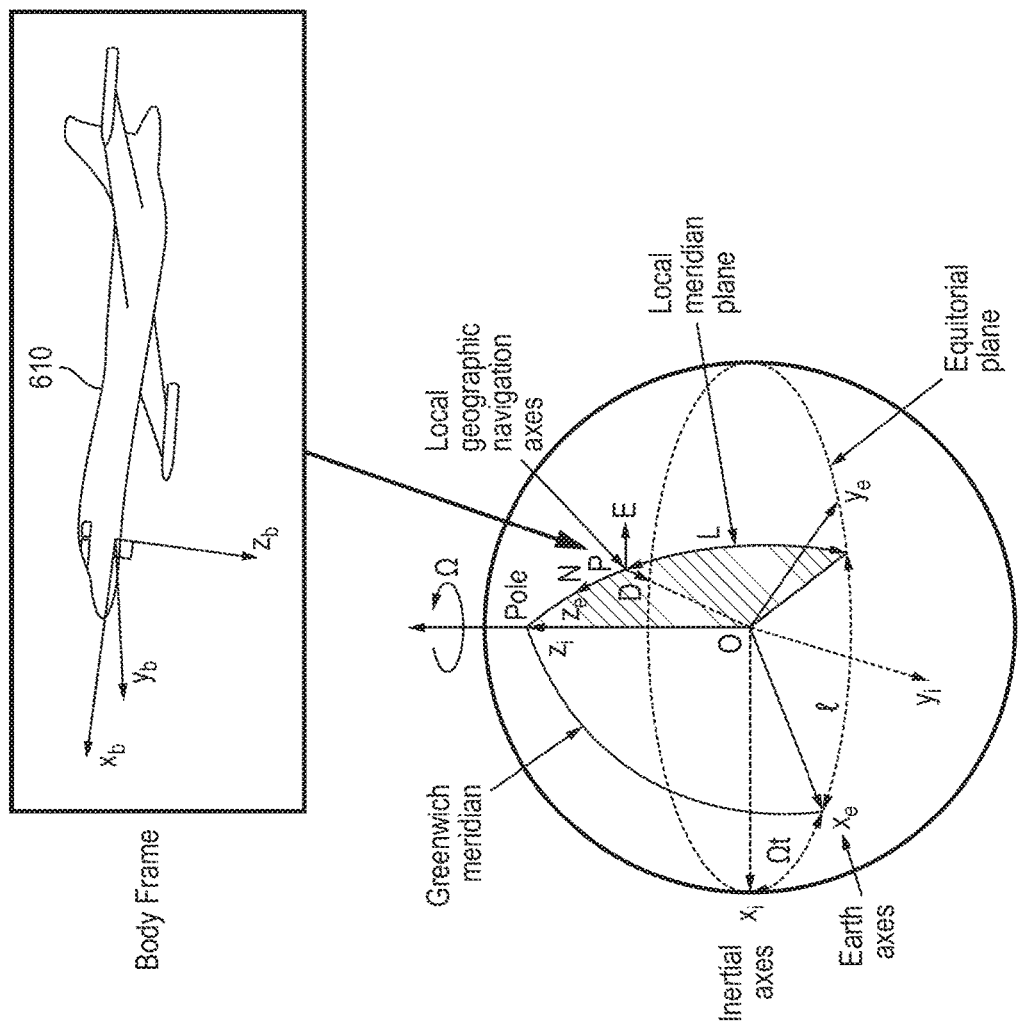
FIG. 6 is a reference frame diagram, according to an embodiment of the present invention.

The reference frames are illustrated in FIG. 6. The first frame is the inertial frame (the i frame, represented by the $x_i$, $y_i$, and $z_i$ axes), which is centered on the center of Earth and fixed relative to distant stars (that is, it doesn't change orientation and ideally provides an absolute reference). The second is the Earth frame (the e frame, represented by the $x_e$, $y_e$, and $z_e$ axes), which is also centered on the center of Earth but fixed to the Earth's surface so that it rotates at the same rate as Earth relative to the inertial frame. The $z_i$ and $z_e$ axes of the i and e frames are both aligned to the polar axis of the Earth about which Earth rotates. This rotation rate is roughly $\Omega_{ie}$=360°/24 hours=15°/h. The $x_e$ axis of the e frame is defined by the intersection of the plane containing the Greenwich meridian and the plane containing the equator, defining a (somewhat arbitrary) zero reference for longitude measurements. The third frame is the navigation frame (n frame), centered at the position of the GMGPS, which is also called the North, East, Down (NED) frame because it defines the local North, East, and Down directions. Finally, the body frame (the b frame, represented by the $x_b$, $y_b$, and $z_b$ axes) represents the vehicle or platform 610 to which the GMGPS sensors are attached and therefore the frame in which the sensor measurements are carried out. Hence, the x, y, and z sensor components in FIG. 5 are understood to refer to the $x_b$, $y_b$, and $z_b$ axes in the b frame.

With the reference frames defined, some relationships between them may be derived. A vector in one reference frame may be expressed in another reference frame through multiplication by a coordinate transformation matrix, often called a direction cosine matrix (DCM). Mathematically, $\vec{u}^n = C_e^n \vec{u}^e$ states that the 3×1 vector $\vec{u}^e$ in the e frame is expressed in the n frame by multiplying its components by the 3×3 DCM $C_e^n$, resulting in the new vector $\vec{u}^n$. This may be written explicitly as $$\vec{u}^n = \begin{bmatrix} u_N^n \\ u_E^n \\ u_D^n \end{bmatrix} = \begin{bmatrix} -sLcl & -sLsl & cL \\ -sl & cl & 0 \\ -cLcl & -cLsl & -sL \end{bmatrix} \begin{bmatrix} u_x^e \\ u_y^e \\ u_z^e \end{bmatrix} = C_e^n \vec{u}^e$$

where l is the longitude and L is the latitude and c or s are operators representing taking the cosine or sine of the following angle, respectively.

Similarly, the relationship between the n frame and the b frame is $$\vec{u}^b = \begin{bmatrix} u_x^b \\ u_y^b \\ u_z^b \end{bmatrix} = \begin{bmatrix} c\theta c\psi & c\theta s\psi & -s\theta \\ -c\phi s\psi + s\phi s\theta c\psi & c\phi c\psi + s\phi s\theta s\psi & s\phi c\theta \\ s\phi s\psi + c\phi s\theta c\psi & -s\phi c\psi + c\phi s\theta s\psi & c\phi c\theta \end{bmatrix} \begin{bmatrix} u_N^n \\ u_E^n \\ u_D^n \end{bmatrix} = C_n^b \vec{u}^n$$

where $\psi$ is the yaw or heading angle, $\theta$ is the pitch or inclination angle, $\phi$ is the roll or bank angle, and again c or s are the operators representing taking the cosine or sine of the following angle. The DCMs are chainable: it is possible to convert from one frame to another frame through an intermediate frame. For example, to go from the e frame to the b frame, the n frame can act as an intermediary. Mathematically, this is expressed as $$\vec{u}^b = C_e^b \vec{u}^e = C_n^b C_e^n \vec{u}^e = \begin{bmatrix} c\theta c\psi & c\theta s\psi & -s\theta \\ -c\phi s\psi + s\phi s\theta c\psi & c\phi c\psi + s\phi s\theta s\psi & s\phi c\theta \\ s\phi s\psi + c\phi s\theta c\psi & -s\phi c\psi + c\phi s\theta s\psi & c\phi c\theta \end{bmatrix}$$
$$\begin{bmatrix} -sLcl & -sLsl & cL \\ -sl & cl & 0 \\ -cLcl & -cLsl & -sL \end{bmatrix} \begin{bmatrix} u_x^e \\ u_y^e \\ u_z^e \end{bmatrix}.$$

If the b frame is in alignment with the n frame, then all of the yaw, pitch, and roll angles are equal to zero ($\psi=\theta=\phi=0$). Making these substitutions in the above gives $$\vec{u}^b = C_n^b C_e^n \vec{u}^e = \begin{bmatrix} 1 & 0 & 0 \\ 0 & 1 & 0 \\ 0 & 0 & 1 \end{bmatrix} \begin{bmatrix} -sLcl & -sLsl & cL \\ -sl & cl & 0 \\ -cLcl & -cLsl & -sL \end{bmatrix} \begin{bmatrix} u_x^e \\ u_y^e \\ u_z^e \end{bmatrix} =$$
$$\begin{bmatrix} -sLcl & -sLsl & cL \\ -sl & cl & 0 \\ -cLcl & -cLsl & -sL \end{bmatrix} \begin{bmatrix} u_x^e \\ u_y^e \\ u_z^e \end{bmatrix} = C_e^n \vec{u}^e = \vec{u}^n.$$

Latitude may then be computed from measurements made by accelerometers and gyroscopes as follows. A full set of three axis, mutually orthogonal accelerometers and gyroscopes aligned to the navigation frame axes (6 total sensors) will measure certain values in this orientation For the accelerometers, the three components are $$\vec{a}^b = \begin{bmatrix} a_x^b \\ a_y^b \\ a_z^b \end{bmatrix} = \vec{a}^n = \begin{bmatrix} a_N^n \\ a_E^n \\ a_D^n \end{bmatrix} = \begin{bmatrix} 0 \\ 0 \\ 1g \end{bmatrix}$$

where the down component of gravity at the Earth's surface will be of strength near one standard $$g \approx 9.81 \frac{m}{s^2}.$$

The exact strength and direction of gravity (i.e., non-zero components of gravity other than straight down) will vary depending on position (latitude, longitude, and altitude) due to variations in the Earth's gravity field, and, accordingly, a gravity model may be utilized for precise geopositioning applications. The three gyroscope components when the b frame is aligned to the n frame are $$\vec{\Omega}^b = \begin{bmatrix} \Omega_x^b \\ \Omega_y^b \\ \Omega_z^b \end{bmatrix} = \vec{\Omega}^n = \begin{bmatrix} \Omega_N^n \\ \Omega_E^n \\ \Omega_D^n \end{bmatrix} = \begin{bmatrix} \Omega_{ie} cL \\ 0 \\ -\Omega_{ie} sL \end{bmatrix}$$

where $\Omega_{ie}$ is again the rotation rate of Earth which is about 15°/h. From the above, it is apparent that the latitude is directly encoded in the gyroscope measurements when the b frame is aligned to the n frame, and can be directly determined from the gyroscope components by taking the inverse tangent of the negative down component divided by the north component:

$$-\frac{\Omega_D^n}{\Omega_N^n} = -\frac{-\Omega_{ie} sL}{\Omega_{ie} cL} = \frac{sL}{cL} = \tan(L) \rightarrow L = \mathrm{atan}\left(-\frac{\Omega_D^n}{\Omega_N^n}\right).$$

However, this method of determining the latitude may be accurate only when the body frame is properly aligned to the n frame; this may not always be the case in a strapdown navigation system (i.e., a system permanently attached in a fixed orientation relative to a vehicle or platform's body). At least two different methods may be utilized to determine latitude by gyrocompassing with the strapdown sensor setup. One such method is to "virtually rotate" the sensor cluster by determining the yaw, pitch, and roll angles and using the correct DCM to convert the sensor measurements in the b frame into the n frame, for which the above equation for latitude then applies. However, this may be a computationally costly calculation resulting in the execution of an unnecessary number of calculations on a processing circuit (e.g., a microprocessor or other computation device) implementing the algorithm (unless such attitude information is desired in addition to the geopositioning information). A second method is to exploit the invariance of the angle between the gravity vector measured by the accelerometers, which always points down in the n frame, and the Earth rotation vector measured by the gyroscopes, which always points in a direction determined by the cosine and sine components of the latitude in the n frame. Multiplying these vectors by the DCM from n to b frame, the resulting vectors expressed in the b frame preserve the relative angle between them, although the x, y, and z sensor axes in the b frame are no longer necessarily aligned to the N, E, and D axes of the n frame due to the arbitrary yaw, pitch, and roll orientation that the vehicle or platform may assume. In other words, the angle between the gravity vector and the Earth rotation rate vector is invariant no matter which frame it is expressed in. Hence, an equation, and therefore an algorithm, may be obtained for calculating the latitude from the accelerometer and gyroscope measurements for an arbitrary orientation of the strapdown navigation system in yaw, pitch, and roll. The algorithm proceeds as follows, in a sequence of numbered acts:

1. Assume platform is stationary and not moving relative to the Earth (or moving and changing orientation very slowly as to effectively be stationary relative to Earth).
2. Normalize the accelerometer and gyroscope measurement vectors.
3. Take the vector dot product of the normalized accelerometer and gyroscope measurement vectors.
4. Take the inverse cosine of the result of act 3.
5. Subtract 90° from the absolute value of the result of act 4 to determine the latitude.

The mathematical justification of the preceding algorithm is as follows (using the n frame since the angle between the vectors is invariant to reference frame as discussed above; i.e., the results are valid when the sensors are measured in the b frame no matter its orientation relative to the n frame). In the equations below, $\alpha$ is the angle between the gravity vector and the Earth rotation rate vector.

$$\frac{\vec{a}^n \cdot \vec{\Omega}^n}{\|\vec{a}^n\| \cdot \|\vec{\Omega}^n\|} = [0\ 0\ 1] \cdot \begin{bmatrix} cL \\ 0 \\ -sL \end{bmatrix} = -sL = c\alpha$$

$$-sL = s(-L) = c(-L - 90°) = c\alpha \rightarrow |\alpha| = L + 90°$$

$$L = |\alpha| - 90° = \left|\mathrm{acos}\left(\frac{\vec{a}^n \cdot \vec{\Omega}^n}{\|\vec{a}^n\| \cdot \|\vec{\Omega}^n\|}\right)\right| - 90°$$

Longitude may be computed from measurements made by accelerometers and magnetometers as follows.

In the method described above, the vector dot product of the normalized 3 axis accelerometer and 3 axis gyroscope sensor measurements determines the latitude L of the GMGPS. Here, in a similar approach, combining the latitude information with the vector dot product of the normalized 3 axis accelerometer and 3 axis magnetometer sensor measurements determines the longitude l:

$$\frac{\vec{a}^n \cdot \vec{B}^n}{\|\vec{a}^n\| \cdot \|\vec{B}^n\|} = [0\ 0\ 1] \cdot \begin{bmatrix} \|\vec{B}^n\| \cdot cIcD \\ \|\vec{B}^n\| \cdot cIsD \\ \|\vec{B}^n\| \cdot sI \end{bmatrix} \cdot \frac{1}{\|\vec{B}^n\|} =$$

$$\frac{\|\vec{B}^n\| \cdot sI}{\|\vec{B}^n\|} = sI = \frac{B_D}{\|\vec{B}^n\|} = \frac{B_D}{\|\vec{B}\|}$$

where I is the magnetic inclination angle and D is the magnetic declination angle, which are both generally functions of longitude, latitude, and altitude. The derivation uses the fact that the norm or magnitude of a vector is invariant under coordinate transformation.

A simple representation of Earth's magnetic field is as a magnetic dipole; this may be referred to as the dipole model of Earth's magnetic field. The World Magnetic Model (WMM2015) is a more precise model (or map) of Earth's magnetic field, the principal components of which contain a useful dipole model. It should be understood that in more precise navigation or geopositioning applications, a magnetic model such as the WMM2015 or even the High Definition Geomagnetic Model [HDGM2015] may be used. However, the simple dipole model obtained here from the WMM2015 coefficients suffices for illustrative purposes and may be useful in embodiments used in applications such as fast GPS locking where ultimate accuracy is not required.

It may be shown using the simple magnetic dipole model from the WMM2015 that the North, East, and Down components of Earth's magnetic field in the n frame are approximately given by $$\vec{B}^n = \begin{bmatrix} B_N \\ B_E \\ B_D \end{bmatrix} = \begin{bmatrix} -\left(\frac{a}{r}\right)^3 [g_1^0 cL - (g_1^1 cl + h_1^1 sl)sL] \\ \left(\frac{a}{r}\right)^3 [g_1^1 sl + h_1^1 cl] \\ -2\left(\frac{a}{r}\right)^3 [g_1^0 sL + (g_1^1 cl + h_1^1 sl)cL] \end{bmatrix}$$

where a=6,371,200 meters is the geomagnetic reference radius of the Earth, r is the radius from the center of the Earth (effectively the altitude plus a), and $g_1^0$=−29438.5 nT, $g_1^1$=−1501.1 nT, and $h_1^1$=4796.2 nT are the first three Gauss coefficients given by the WMM2015 (in Section 1.3, Table 2). The cL, sL, cl, and sl again represent the cosine and sine dependencies of the latitude L and longitude l, respectively. Since the latitude was determined above by the accelerometer and gyroscope readings, only the longitude remains to be determined. This may be accomplished by observing from the dot product that $$\frac{\vec{a}^n \cdot \vec{B}^n}{\|\vec{a}^n\| \cdot \|\vec{B}^n\|} = sI = \frac{B_D}{\|\vec{B}\|} = \sin\left(\arctan\left(\frac{B_D}{\sqrt{B_N^2 + B_E^2}}\right)\right) = \frac{B_D}{\sqrt{B_N^2 + B_E^2 + B_D^2}}$$

where the $B_N$, $B_E$, and $B_D$ magnetic field components only have longitudinal dependence once the latitude derived from gyroscopes and accelerometers is substituted in (i.e., the $B_N$, $B_E$, and $B_D$ depend on both latitude and longitude, and their dependence on longitude depends on the latitude).

Making this explicit yields $$sl = \frac{B_D}{\sqrt{B_N^2 + B_E^2 + B_D^2}}$$

$$= -\frac{2 \cdot [g_1^0 sL + (g_1^1 cl + h_1^1 sl)cL]}{[g_1^0 cL - (g_1^1 cl + h_1^1 sl)sL]^2 + [g_1^1 sl + h_1^1 cl]^2 +}$$
$$4 \cdot [g_1^0 sL + (g_1^1 cl + h_1^1 sl)cL]^2$$

$$= \frac{\vec{a}^n \cdot \vec{B}^n}{\|\vec{a}^n\| \cdot \|\vec{B}^n\|}$$

Although the above expression does not simplify much further even in the simple dipole model for a useful closed form expression (the above form may be solved numerically, however), it is enough to determine an algorithm for determining longitude from the accelerometer and magnetometer readings, given that the latitude has previously been determined by the accelerometer and gyroscope readings. This algorithm may include the following acts:

0. Assume GMGPS platform is stationary and not moving relative to Earth (or moving and changing orientation very slowly as to effectively be stationary relative to Earth). Assume gyrocompassing has been performed using accelerometers and gyroscopes as described in the previous section to determine the latitude L of the GMGPS.
1. Normalize the accelerometer and magnetometer measurement vectors
2. Take the vector dot product of the normalized accelerometer and magnetometer measurement vectors
3. Equate the result of act 2 to the explicit expression for sl above determined by the simple dipole model, substituting appropriate numerical factors and L
4. Numerically solve the equation resulting from act 3 for longitude l As when determining latitude, the specific reference frame used when making the sensor measurement vectors is irrelevant, since the vector dot product is invariant under coordinate frame transformations (with the restriction that both vectors have to be expressed in the same reference frame). Therefore, the body frame b may be used to make the measurements, although the n frame was used to simplify the derivation of the algorithm. If a magnetic model such as WMM2015 is to be used, act 3 may be modified to use the appropriate expression for sl as defined by the model. This may involve the use of a computer algorithm implementing the model. While the described method uses the accelerometer and magnetometer dot product to get the longitude, a similar method may be utilized, which utilizes the gyroscope and magnetometer dot product to also obtain the longitude through the cosine of the declination angle D. In another embodiment both methods are used, and a weighted average of the two longitude estimates is formed.

Altitude may be calculated from measurements of total gravity field and total magnetic field as follows. Once latitude L and longitude l have been determined (e.g., according to the methods disclosed above), the remaining geopositioning variable of interest is the altitude h≈r−a. The Earth's magnetic field may have approximately a $$\frac{1}{r^3}$$

dependence. Similarly, the gravity field of Earth may have approximately a $$\frac{1}{r^2}$$

dependence. Internal to the Earth, both fields may deviate from these simple dependency laws significantly, and therefore, detailed magnetic [WMM2015/HDGM2015] and gravity field models [EGM2008] for the Earth may be used. A simple model for Earth's gravity field is:

$$g(h) = \frac{g(0)}{\left(1 + \frac{h}{a}\right)^2}$$

$$g(0) = 9.780318(1 + 5.3024 \cdot 10^{-3} \cdot \sin^2 L - 5.9 \cdot 10^{-6} \cdot \sin^2 2L) \text{ m/s}^2$$

In the above equation, the gravity field has a small latitude dependence, but since the latitude has already been determined using a method that is independent of the accelerometer measurement vector norm or magnitude, the known latitude may be substituted in to the gravity model and compared with the total accelerometer measurement vector magnitude to determine the altitude. If a more complicated model is used for gravity or magnetic field (e.g., the EGM2008 or the WMM/12015/HDGM2015, respectively), the same principle applies: the known latitude and longitude positions may be substituted in and then the magnitude of either the acceleration measurement vector or the magnetometer measurement vector may be compared to the predictions of the respective models as a function of altitude, depending on the type of model employed to compute the altitude. Two altitudes may be determined in this manner, one from the gravity model, and one from the magnetic model. However, (e.g., using a Kalman Filter algorithm), these two altitudes may be weighed together based on their relative accuracies to determine a final altitude which is a more accurate value possible based on the available sensor measurements.

In the above derivations, it is assumed that the sensor clusters are properly calibrated and aligned to each other. A strapdown sensor may be calibrated as follows. The process of calibration may involve determining the scale factor matrices $M_{ij}$ and bias vectors $B_i$ for each sensor defined by (employing gyroscopes as the example sensor triad)

$$\begin{bmatrix} \hat{\Omega}_x \\ \hat{\Omega}_y \\ \hat{\Omega}_z \end{bmatrix} = \begin{bmatrix} M_{11} & M_{12} & M_{13} \\ M_{21} & M_{22} & M_{23} \\ M_{31} & M_{32} & M_{33} \end{bmatrix} \begin{bmatrix} \Omega_x \\ \Omega_y \\ \Omega_z \end{bmatrix} + \begin{bmatrix} B_x \\ B_y \\ B_z \end{bmatrix},$$

where hatted quantities are the measured values from the gyroscopes and the unhatted quantities are the known input stimuli (e.g., rate table inputs, or Earth rate). In the absence of error, $\hat{\Omega}-\Omega=0$. $\epsilon=(\hat{\Omega}-M\Omega-B)$ may be defined as the residual error vector. Therefore, matrix elements of M and vector components of B that minimize E are sought. This may be expressed as:

$$\text{argmin}_{M,B} \|\epsilon\|.$$

Numerical least-squares minimization may be used to find the M and B that satisfy the above, based on a repeated set of measurements when the sensor triad is oriented at a minimum of 12 or more orientations relative to the reference input.

The resulting calibrated sensor suite may be composed of multiple sensors not necessarily aligned along the three orthogonal axes. In other words, the three-axis gyroscope, three-axis accelerometer, or three-axis magnetometer used to derive the respective measurement vector may be considered as a "virtual three-axis sensor". For example, in one embodiment a three axis gyroscope might make use of 3 one-axis gyroscopes, and the angle between any pair of the sensor axes of the one-axis gyroscopes may not be 90 degrees. In such an embodiment, a virtual triad of orthogonal one-axis gyroscopes, forming a virtual 3-axis gyroscope, may be created from the three non-orthogonal physical sensors. Alternatively, 4 physical one-axis gyroscopes may be used to create the virtual triad of three orthogonal gyroscopes, forming a virtual 3-axis gyroscope, by extending M and B above. Thus, embodiments of the present invention may be used in non-standard sensor configurations by employing the calibrated "virtual triad" of sensors resulting from the true physical arrangement of the sensors.

Figure 7:
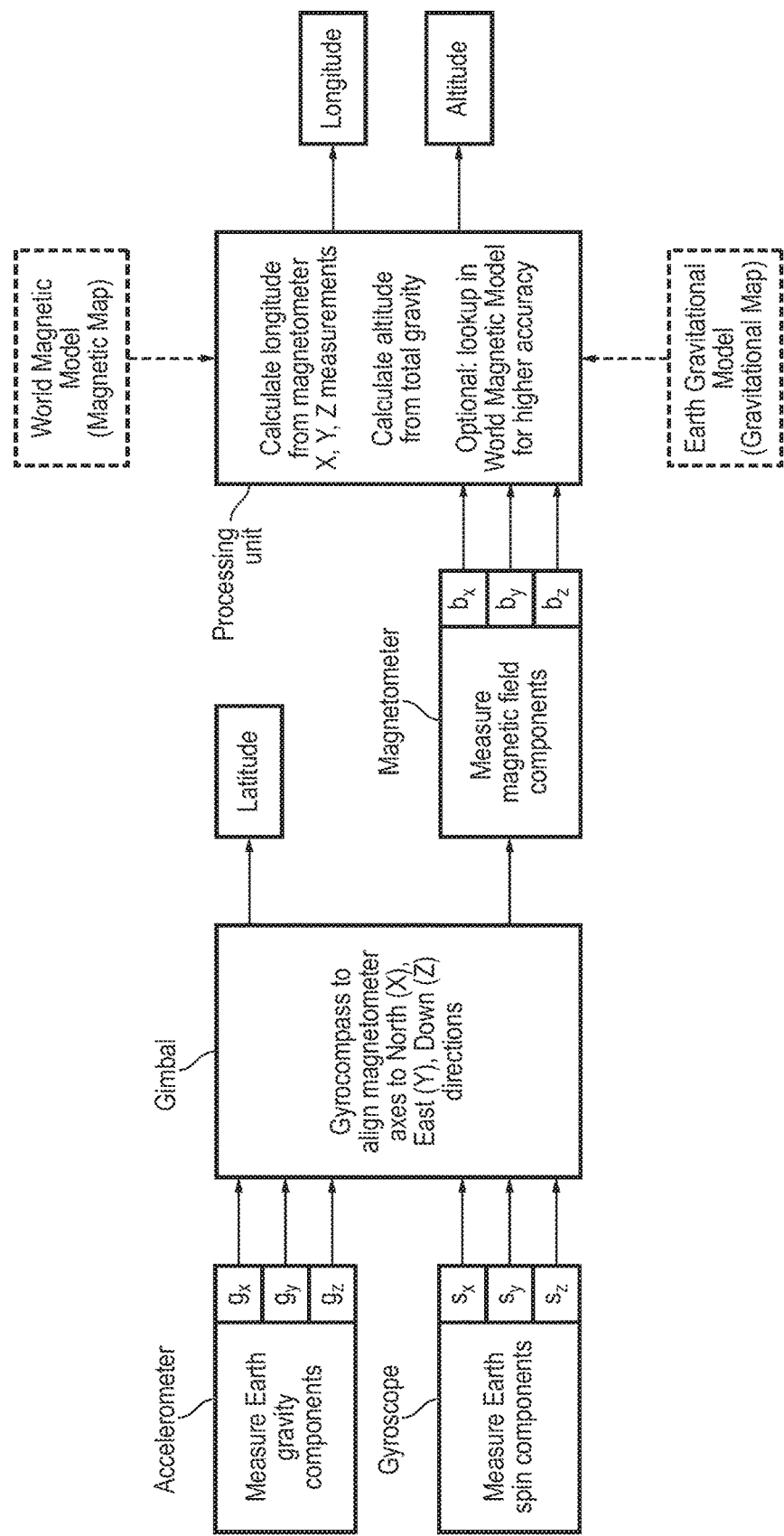
FIG. 7 is a hybrid block and data flow diagram and flow chart of an embodiment of the present invention.

FIG. 7 shows an alternate embodiment of the present invention, in which a gyrocompassing act is first performed to align the magnetometer axes to North, East, and Down. In this embodiment, at least 2 accelerometers and 1 high performance gyro are used, reducing the total number of sensor DOFs to 6 (although 3-axis devices may still be used to confirm the orientation). Again, a lookup act, in which a more accurate gravitational model and/or magnetic model is used, may be included to increase the accuracy of the position determination. Finally, altitude may be calculated as before from the strength of the total gravity and magnetic fields.

In non-strapdown systems (for example, systems in which the sensors may be mounted on a gimbaled platform) the orientation of the navigation system may be caused to be aligned to the n frame despite the vehicle or platform axes not being aligned to the n frame. Effectively, in practice, this refers to a gimbaled table (which in this embodiment defines the b frame) containing the sensors is first aligned in the local horizontal plane using the accelerometers, and then a gyroscope is used to find East by rotating the table in the local horizontal plane until a minimum rotation is detected by the gyroscope (finding the table orientation such that $\Omega_y^b = \Omega_E^n = 0$). In this way, the x, y, and z axes of the b frame defining the sensor axes are brought into alignment with the N, E, and D directions of the n frame. This method may carry certain costs: (1) it may use an expensive and bulky gimbal mechanism, (2) the physical performing of the alignment of the b frame to the n frame may result in additional time or delay, and (3) vehicle or platform motion may interfere with the physical alignment process. However, a benefit of this method may be that the number of necessary sensors may be reduced to a 2-axis accelerometer (for finding the local horizon plane) and a one-axis gyroscope (for finding the East null rate). A further benefit may be that a 2-axis magnetometer may be sufficient, e.g., a magnetometer having a north-south axis and an east-west axis, or a magnetometer having an up-down axis and an east-west axis. The total magnetic field information may then be derived according to the equation for $\vec{B}^n$ above when gyrocompassing has been performed to align XYZ with the NED frame.

In some embodiments the GMGPS may calculate the attitude of the GMGPS in addition to the position of the GMGPS relative to the Earth's surface. In some embodiments the GMGPS may be used to calculate the attitude of the GMGPS, and the position of the GMGPS, relative to the surface of another body (not the Earth), e.g., of another planet that, like the Earth, has an axis of rotation and a magnetic field axis that are not perfectly aligned with each other.

In some embodiments, the position and/or attitude calculated by the GMGPS are utilized for guidance, i.e., to control the position, velocity, and/or attitude of a vehicle carrying the GMGPS. In some the position and/or attitude calculated by the GMGPS are utilized, e.g., to guide another vehicle to the position of a vehicle carrying the GMGPS, to launch a second vehicle (or projectile) from the vehicle carrying the GMGPS to intercept a target (e.g., a stationary target or a third vehicle) or to aim a steerable instrument (e.g., a radio or laser transmitter or receiver) at a target.

In some embodiments calculations may be performed using one or more processing circuits. The term "processing circuit" is used herein to include any combination of hardware, firmware, and software, employed to process data or digital signals. Processing circuit hardware may include, for example, application specific integrated circuits (ASICs), general purpose or special purpose central processing units (CPUs), digital signal processors (DSPs), graphics processing units (GPUs), and programmable logic devices such as field programmable gate arrays (FPGAs). In a processing circuit, as used herein, each function is performed either by hardware configured, i.e., hard-wired, to perform that function, or by more general purpose hardware, such as a CPU, configured to execute instructions stored in a non-transitory storage medium. A processing circuit may be fabricated on a single printed wiring board (PWB) or distributed over several interconnected PWBs. A processing circuit may contain other processing circuits; for example a processing circuit may include two processing circuits, an FPGA and a CPU, interconnected on a PWB.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section, without departing from the spirit and scope of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that such spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concept. As used herein, the terms "substantially," "about," and similar terms are used as terms of approximation and not as terms of degree, and are intended to account for the inherent deviations in measured or calculated values that would be recognized by those of ordinary skill in the art. As used herein, the term "major component" refers to a component constituting at least half, by weight, of a composition, and the term "major portion", when applied to a plurality of items, means at least half of the items.

As used herein, the singular forms "a", "an" and "the" are intended to include the plural forms as well, unless the context clearly indicates otherwise. It will be further understood that the terms "comprises" and/or "comprising", when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list. Further, the use of "may" when describing embodiments of the inventive concept refers to "one or more embodiments of the present invention". Also, the term "exemplary" is intended to refer to an example or illustration. As used herein, the terms "use," "using," and "used" may be considered synonymous with the terms "utilize," "utilizing," and "utilized," respectively.

It will be understood that when an element or layer is referred to as being "on", "connected to", "coupled to", or "adjacent to" another element or layer, it may be directly on, connected to, coupled to, or adjacent to the other element or layer, or one or more intervening elements or layers may be present. In contrast, when an element or layer is referred to as being "directly on", "directly connected to", "directly coupled to", or "immediately adjacent to" another element or layer, there are no intervening elements or layers present.

Any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein.

Although exemplary embodiments of a gyromagnetic geopositioning system have been specifically described and illustrated herein, many modifications and variations will be apparent to those skilled in the art. Accordingly, it is to be understood that a gyromagnetic geopositioning system constructed according to principles of this invention may be embodied other than as specifically described herein. The invention is also defined in the following claims, and equivalents thereof.

What is claimed is:

1. A geopositioning system comprising:
an accelerometer comprising three sensing axes;
a gyroscope comprising three sensing axes;
a magnetometer comprising three sensing axes; and
a processing circuit comprising a non-transitory storage medium, the non-transitory storage medium having instructions stored therein, which, when executed by the processing circuit, cause the processing circuit to calculate a location of the geopositioning system as a latitude, longitude, and altitude with respect to the Earth based on a combined output of the accelerometer, the gyroscope, and the magnetometer,
wherein the calculating of the location comprises:
determining a plane of a local horizon from measurements performed by the accelerometer;
determining a direction of a spin axis of the Earth from measurements performed by the gyroscope; and
calculating the latitude from the angle between the local horizon and the spin axis.

2. The geopositioning system of claim 1, wherein the calculating of the latitude comprises:
forming a dot product between
a normal vector to the plane of the local horizon, and
a normalized vector in the direction of the spin axis of the Earth;
calculating an inverse cosine of the dot product; and
subtracting 90 degrees from the inverse cosine.

3. The geopositioning system of claim 2, wherein the calculating of the location further comprises:
calculating the longitude from
the spin axis; and
measurements obtained by the magnetometer.

4. The geopositioning system of claim 3, wherein the calculating of the longitude comprises numerically solving for a value of l for which $$\frac{\vec{a}^n \cdot \vec{B}^n}{\|\vec{a}^n\| \cdot \|\vec{B}^n\|} = -\frac{2 \cdot [g_1^0 sL + (g_1^1 cl + h_1^1 sl)cL]}{[g_1^0 cL - (g_1^1 cl + h_1^1 sl)sL]^2 + [g_1^1 sl + h_1^1 cl]^2 + 4 \cdot [g_1^0 sL + (g_1^1 cl + h_1^1 sl)cL]^2}$$

wherein
$\vec{a}^n$ is an acceleration vector measured by the accelerometer;
$\vec{B}^n$ is a magnetic field vector measured by the magnetometer;
$g_1^0$, $g_1^1$, and $h_1^1$ are three coefficients of a magnetic field model for the Earth;
cL and sL are the sine and cosine respectively of the latitude;
l is the longitude; and
cl, and sl are the sine and cosine respectively of the longitude.

5. The geopositioning system of claim 4, wherein:
$g_1^0 = -29438.5$ nanoTesla (nT);
$g_1^1 = -1501.1$ nT; and
$h_1^1 = 4796.2$ nT.

6. The geopositioning system of claim 1, wherein the calculating of the altitude comprises calculating the altitude from measurements obtained by the accelerometer.

7. The geopositioning system of claim 6, wherein the calculating of the altitude from measurements obtained by the accelerometer comprises:
calculating a magnitude of an acceleration vector measured by the accelerometer; and determining an altitude at which a magnitude predicted by a gravitational model of the Earth equals the magnitude of the acceleration vector.

8. The geopositioning system of claim 7, wherein the gravitational model of the Earth represents the Earth's gravitational field as being proportional to $$\frac{1}{r^2},$$

where r is the radius from the center of the Earth.

9. The geopositioning system of claim 1, wherein the calculating of the altitude comprises calculating the altitude from measurements obtained by the magnetometer.

10. The geopositioning system of claim 9, wherein the calculating of the altitude from measurements obtained by the magnetometer comprises:
   calculating a magnitude of a magnetic field vector measured by the magnetometer; and
   determining an altitude at which a magnitude predicted by a magnetic model of the Earth equals the magnitude of the magnetic field vector.

11. The geopositioning system of claim 10, wherein the magnetic model represents the Earth's magnetic field as being proportional to $$\frac{1}{r^3},$$

where r is the radius from the center of the Earth.

12. The geopositioning system of claim 1, wherein the calculating of the altitude comprises calculating the altitude from:
   measurements obtained by the accelerometer; and
   measurements obtained by the magnetometer.

13. The geopositioning system of claim 12, wherein the calculating of the altitude comprises calculating the altitude as a weighted average of:
   an altitude calculated from measurements obtained by the accelerometer; and
   an altitude calculated from measurements obtained by the magnetometer.

14. The geopositioning system of claim 13, wherein weights of the weighted average are selected to provide, in the weighted average, a measurement error less than the measurement error in an equally-weighted average of:
   the altitude calculated from measurements obtained by the accelerometer; and
   the altitude calculated from measurements obtained by the magnetometer.

15. A geopositioning system comprising:
   an accelerometer comprising three sensing axes;
   a gyroscope comprising three sensing axes;
   a magnetometer comprising three sensing axes;
   a gimbaled support; and
   a processing circuit comprising a non-transitory storage medium, the accelerometer, the gyroscope, and the magnetometer being secured to the gimbaled support,
   wherein the non-transitory storage medium has instructions stored therein, which, when executed by the processing circuit, cause the processing circuit to control the gimbaled support and to calculate a location of the geopositioning system as a latitude, longitude, and altitude with respect to the Earth based on a combined of the accelerometer, the gyroscope, and the magnetometer, and
   wherein the calculating of the location comprises:
      determining a plane of a local horizon from measurements performed by the accelerometer;
      determining a direction of a spin axis of the Earth from measurements performed by the gyroscope; and
      calculating the latitude from the angle between the local horizon and the spin axis.

16. The geopositioning system of claim 15, wherein the two sensing axes of the accelerometer define a plane, and the gyroscope is secured to the gimbaled support with the sensing axes of the gyroscope in the plane.

17. The geopositioning system of claim 15, wherein the processing circuit is configured to rotate the gimbaled support to an attitude at which each of the two sensing axes of the accelerometer measures no acceleration, and at which the sensing axis of the gyroscope measures no rotation.

18. The geopositioning system of claim 17, wherein the processing circuit is further configured to calculate the longitude by numerically solving for a value of l for which $$\frac{\vec{a}^n \cdot \vec{B}^n}{\|\vec{a}^n\| \cdot \|\vec{B}^n\|} = -\frac{2 \cdot [g_1^0 sL + (g_1^1 cl + h_1^1 sl)cL]}{[g_1^0 cL - (g_1^1 cl + h_1^1 sl)sL]^2 + [g_1^1 sl + h_1^1 cl]^2 + 4 \cdot [g_1^0 sL + (g_1^1 cl + h_1^1 sl)cL]^2}$$

wherein
   $\vec{a}^n$ is an acceleration vector measured by the accelerometer;
   $\vec{B}^n$ is a magnetic field vector measured by the magnetometer;
   $g_1^0$, $g_1^1$, and $h_1^1$ are three first Gauss coefficients of a magnetic field model for the Earth;
   cL and sL are the sine and cosine respectively of the latitude;
   l is the longitude; and
   cl, and sl are the sine and cosine respectively of the longitude.

19. The geopositioning system of claim 17, wherein the calculating of the altitude comprises calculating the altitude as a weighted average of:
   an altitude calculated from measurements obtained by the accelerometer; and
   an altitude calculated from measurements obtained by the magnetometer.

20. A method for determining a location of a geopositioning system, the geopositioning system comprising:
   an accelerometer comprising three sensing axes;
   a gyroscope comprising three sensing axes; and
   a magnetometer comprising three sensing axes,
   the method comprising calculating the location of the geopositioning system as a latitude, longitude, and altitude with respect to the Earth based on a combined output of the accelerometer, the gyroscope, and the magnetometer,
   wherein the calculating of the location comprises:
      determining a plane of a local horizon from measurements performed by the accelerometer;
      determining a direction of a spin axis of the Earth from measurements performed by the gyroscope; and
      calculating the latitude from the angle between the local horizon and the spin axis.

* * * * *